(12) United States Patent
Park et al.

(10) Patent No.: US 11,728,464 B2
(45) Date of Patent: Aug. 15, 2023

(54) LIGHT EMITTING ELEMENT, MANUFACTURING METHOD THEREOF, AND COMPOSITION INCLUDING THE SAME

(71) Applicant: Samsung Display Co., Ltd., Yongin-si (KR)

(72) Inventors: Jong Won Park, Yongin-si (KR); Chang Hee Lee, Yongin-si (KR); Duk Ki Kim, Yongin-si (KR); Yun Ku Jung, Yongin-si (KR); Yun Hyuk Ko, Yongin-si (KR); Jae Kook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 264 days.

(21) Appl. No.: 16/935,095

(22) Filed: Jul. 21, 2020

(65) Prior Publication Data

US 2021/0226103 A1 Jul. 22, 2021

(30) Foreign Application Priority Data

Jan. 16, 2020 (KR) .................. 10-2020-0006124

(51) Int. Cl.
| | |
|---|---|
| *H01L 33/56* | (2010.01) |
| *H01L 33/36* | (2010.01) |
| *C08G 61/10* | (2006.01) |
| *C08L 47/00* | (2006.01) |
| *C08L 65/02* | (2006.01) |
| *H01L 33/00* | (2010.01) |

(52) U.S. Cl.
CPC .............. *H01L 33/56* (2013.01); *C08G 61/10* (2013.01); *C08L 47/00* (2013.01); *C08L 65/02* (2013.01); *H01L 33/0095* (2013.01); *H01L 33/36* (2013.01); *C08G 2261/3142* (2013.01); *H01L 2933/005* (2013.01)

(58) Field of Classification Search
CPC .......... H01L 33/08; H01L 33/44; H01L 33/56
See application file for complete search history.

(56) References Cited

U.S. PATENT DOCUMENTS

2018/0019369 A1   1/2018   Cho et al.

FOREIGN PATENT DOCUMENTS

| KR | 10-0850482 B1 | 8/2008 |
|---|---|---|
| KR | 10-2018-0007376 A | 1/2018 |

(Continued)

OTHER PUBLICATIONS

Kang, Jung-Hyun et al., "Defect-Free GaAs/AlGaAs Core-Shell Nanowires on Si Substrates," American Chemical Society, Cryst. Growth Des., 2011, 11, pp. 3109-3114.

(Continued)

*Primary Examiner* — Daniel P Shook
(74) *Attorney, Agent, or Firm* — Lewis Roca Rothgerber Christie LLP

(57) ABSTRACT

A light emitting element includes a first semiconductor layer; an active layer on the first semiconductor layer; a second semiconductor layer on the active layer; an insulating film surrounding an outer peripheral surface of each of the first semiconductor layer, the active layer and the second semiconductor layer; and a polymer film including a polymer chain and on at least a portion of a surface of the insulating film.

15 Claims, 9 Drawing Sheets

(56) References Cited

FOREIGN PATENT DOCUMENTS

WO    WO 2016/080709 A1    5/2016
WO    WO-2016080709 A1 *    5/2016   ............... F21K 2/00

OTHER PUBLICATIONS

Atanase Leonard et al: "Self-Assembly of Block and Graft Copolymers in Organic Solvents: An overview of Recent Advances", Polymers, vol. 10, No. 1, Jan. 11, 2018, (pp. 1-26).
Extended European Search Report issued by the EPO dated Mar. 15, 2021, for corresponding European Patent Application No. 20196980.5 (8 pages).

* cited by examiner

LIGHT EMITTING ELEMENT, MANUFACTURING METHOD THEREOF, AND COMPOSITION INCLUDING THE SAME

CROSS-REFERENCE TO RELATED APPLICATION

This application claims priority to and the benefit of Korean Patent Application No. 10-2020-0006124, filed in the Korean Intellectual Property Office on Jan. 16, 2020, the entire contents of which are incorporated herein by reference.

BACKGROUND

1. Field

Embodiments of the present disclosure relate to a light emitting element, a method of manufacturing of the light emitting element, and a composition including the light emitting element.

2. Description of the Related Art

A light emitting diode (hereinafter referred to as LED) has relatively good durability even in harsh environmental conditions and has excellent performance in terms of life-span and luminance. Recently, researches for applying such LEDs to various display devices have been actively conducted.

As a part of this research, a technique for manufacturing an ultra-small rod-shaped LED, which is as small as a micro scale or a nano scale, has been developed using an inorganic crystal structure, for example, a structure in which a nitride semiconductor is grown. For example, the rod-shaped LED may be manufactured in a size small enough to constitute a pixel of a self-luminous display device.

SUMMARY

An exemplary embodiment of the present disclosure provides a light emitting element having excellent dispersibility and dispersion stability in a solution, a method of manufacturing the light emitting element, and a composition including the light emitting element.

A light emitting element according to an exemplary embodiment of the present disclosure includes a first semiconductor layer; an active layer on the first semiconductor layer; a second semiconductor layer on the active layer; an insulating film surrounding an outer peripheral surface of each of the first semiconductor layer, the active layer and the second semiconductor layer; and a polymer film including a polymer chain and on at least a portion of a surface of the insulating film.

In an exemplary embodiment of the present disclosure, the light emitting element may further include an electrode layer on the second semiconductor layer.

In an exemplary embodiment of the present disclosure, the polymer film may further include a linker compound coupling the surface of the insulating film and an end of the polymer chain.

In an exemplary embodiment of the present disclosure, the linker compound may be a compound containing at least one of a $C_1$-$C_{20}$ alkylene group, an alkylamine group represented by —$(CH_2)_n$—$NR_1$— (wherein n is an integer of 1 or more, and $R_1$ is hydrogen or a $C_1$-$C_{20}$ alkyl group), a $C_1$-$C_{20}$ ester group, a $C_1$-$C_{20}$ ketone group, a $C_1$-$C_{20}$ amide group, and a siloxane group.

In an exemplary embodiment of the present disclosure, the polymer chain may include an aliphatic hydrocarbon repeat unit in a main chain.

In an exemplary embodiment of the present disclosure, the main chain of the polymer chain may have a carbon number of 10 or more.

In an exemplary embodiment of the present disclosure, the polymer chain may include a repeat unit including an aromatic ring in the main chain.

In an exemplary embodiment of the present disclosure, a main chain of the polymer chain may include 10 or more aromatic rings.

In an exemplary embodiment of the present disclosure, at least one substituent selected from a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group and a thiol group may be bonded to the main chain of the polymer chain.

In an exemplary embodiment of the present disclosure, the polymer chain may include a repeat unit represented by a following Chemical Formula 1.

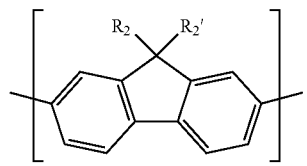

Chemical Formula 1

In Chemical Formula 1, each of $R_2$ and $R_2'$ is independently hydrogen, a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

In an exemplary embodiment of the present disclosure, the polymer chain may include a repeat unit represented by a following Chemical Formula 2.

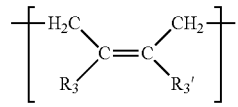

Chemical Formula 2

In Chemical Formula 2, each of $R_3$ and $R_3'$ is independently hydrogen, a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

In an exemplary embodiment of the present disclosure, the polymer chain may include a repeat unit represented by a following Chemical Formula 3.

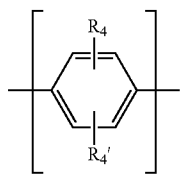

Chemical Formula 3

In Chemical Formula 3, each of $R_4$ and $R_4'$ is independently hydrogen, a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

In an exemplary embodiment of the present disclosure, a molecular weight of the polymer chain may be 2,000 g/mol or more and 1,000,000 g/mol or less.

In an exemplary embodiment of the present disclosure, a thickness of the polymer film may be 10 nm or more and 100 nm or less.

A method of manufacturing a light emitting element according to an exemplary embodiment of the present disclosure includes forming a light emitting stack in which a first semiconductor layer, an active layer, and a second semiconductor layer are sequentially stacked on a substrate; etching the light emitting stack to form a light emitting stacked pattern; forming an insulating film on the light emitting stacked pattern; and forming a polymer film including a polymer chain on at least portion of a surface of the insulating film.

In an exemplary embodiment of the present disclosure, the forming the polymer film may include introducing a linker compound to a surface of the insulating film.

In an exemplary embodiment of the present disclosure, in the forming the polymer film, an end of the polymer chain formed by polymerization of monomers may be bonded to the linker compound.

In an exemplary embodiment of the present disclosure, in the forming the polymer film, monomers may be polymerized in the linker compound to form the polymer chain.

A composition according to an exemplary embodiment of the present disclosure includes a solvent; and a light emitting element. The light emitting element includes a first semiconductor layer; an active layer on the first semiconductor layer; a second semiconductor layer on the active layer; an insulating film surrounding an outer peripheral surface of each of the first semiconductor layer, the active layer and the second semiconductor layer; and a polymer film including a polymer chain and on at least a portion of a surface of the insulating film.

In an exemplary embodiment of the present disclosure, the solvent contains at least one of an alkyl solvent containing an alkyl group, an ether solvent containing an ether group, an ester solvent containing an ester group, an amine solvent containing an amine group, an amide solvent containing an amide group, an alcohol solvent containing an alcohol group, a urethane solvent containing a urethane group, a urea solvent containing a urea group, an imide solvent containing an imide group, an acrylic solvent containing an acrylic group, or a thiol solvent containing a thiol group.

An exemplary embodiment of the present disclosure can provide light a light emitting element having excellent dispersibility and/or solubility in a solvent.

For example, according to an exemplary embodiment of the present disclosure, by providing a polymer film containing a polymer chain to the light emitting element, it is possible to improve the dispersibility and dispersion stability in the solvent.

However, the effect of the present disclosure is not limited to the effects described above, but may be variously extended in a range that does not depart from the spirit and scope of the present disclosure.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
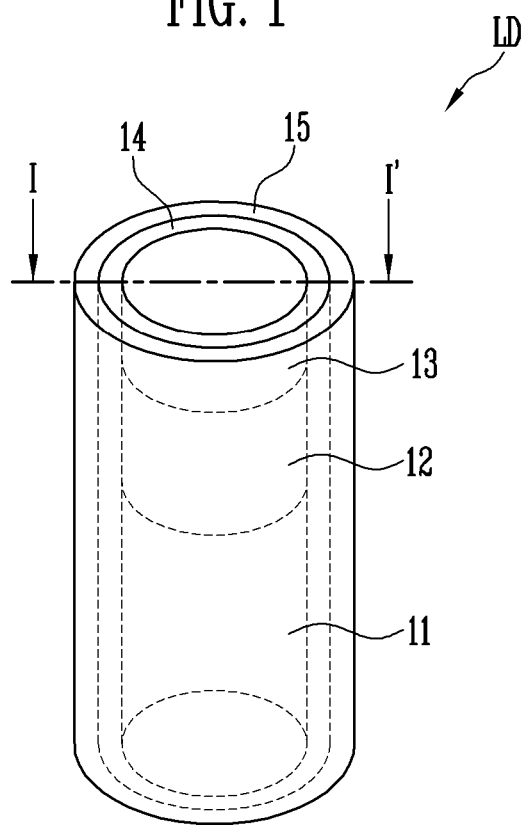
FIG. 1 is a perspective view showing a light emitting element according to an exemplary embodiment of the present disclosure.

It will be apparent to those skilled in the art that various modifications and variations can be made to the subject matter of the present disclosure without departing from the spirit or scope of the disclosure, and certain exemplary embodiments are exemplified in the drawings and explained in the detailed description. Thus, it is intended that the present disclosure covers suitable modifications and variations of the subject matter of this disclosure provided they come within the spirit and scope of the present disclosure and their equivalents.

Like reference numerals designate like elements throughout the specification. In the accompanying drawings, dimensions of structures may be exaggerated for clarity. The terms, 'first', 'second' and the like may be simply used for description of various constituent elements, but those meanings may not be limited to the restricted meanings. The above terms are used only for distinguishing one constituent element from other constituent elements. For example, a first constituent element may be referred to as a second constituent element and similarly, the second constituent element may be referred to as the first constituent element within the scope of the appended claims. When explaining the singular, unless explicitly described to the contrary, it may be interpreted as the plural meaning.

In the specification, the word "comprise" or "has" is used to specify existence of a feature, a numbers, a process, an operation, a constituent element, a part, or a combination thereof, and it will be understood that existence or additional possibility of one or more other features or numbers, processes, operations, constituent elements, parts, or combinations thereof are not excluded in advance. In addition, it will be understood that when an element such as a layer, film, region, or substrate is referred to as being "on" another element, it can be directly on the other element or intervening elements may also be present. In the specification, it will be understood that when an element such as a layer, film, region, or substrate is referred to as being "on" another element, the direction of the stacking is not limited to an upper direction and may include stacking in a side direction or a lower direction. Additionally, it will be understood that when an element such as a layer, film, region, or substrate is referred to as being "beneath" another element, it can be directly beneath the other element or intervening elements may also be present.

In the present specification, the term "repeat unit" may refer to a form in which a monomer is reacted in a polymer, and may refer to a form in which monomers form a backbone of the polymer e.g., a main chain of the polymer chain through a polymerization reaction.

Hereinafter, exemplary embodiments of the present disclosure will be described in further detail with reference to the accompanying drawings.

Figure 2A:
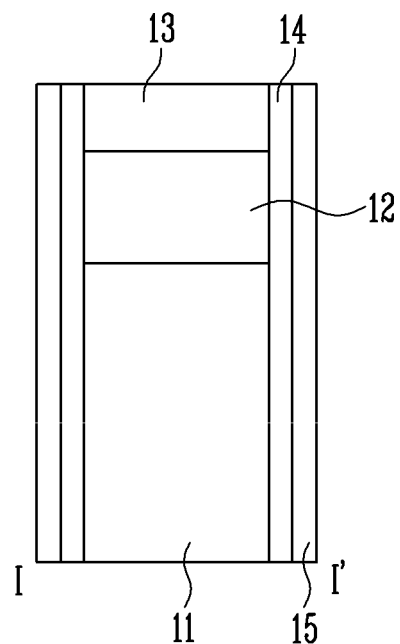
FIGS. 2A and 2B are cross-sectional views showing light emitting elements according to various exemplary embodiments of the present disclosure taken along a line I-I' of FIG. 1.
Figure 2B:
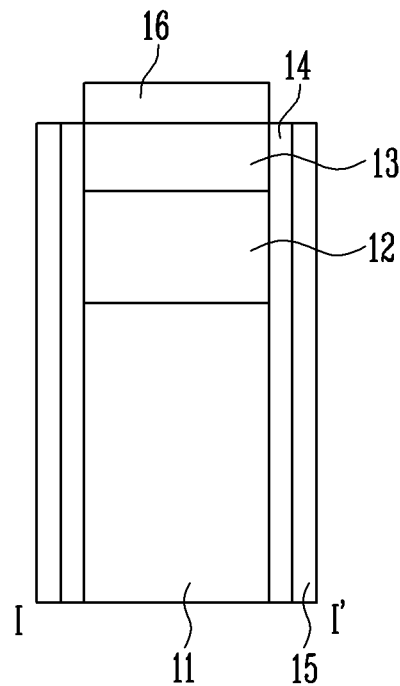
Figure 3:
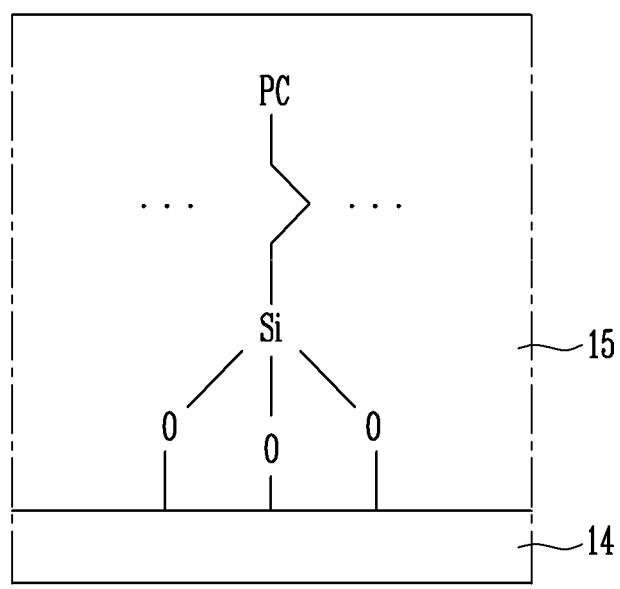
FIG. 3 is a cross-sectional view schematically showing a polymer film on a surface of an insulating film according to an exemplary embodiment of the present disclosure.

FIG. 1 is a perspective view showing a light emitting element according to an exemplary embodiment of the present disclosure, FIGS. 2A and 2B are cross-sectional views showing light emitting elements according to various exemplary embodiments of the present disclosure taken along a line I-I' of FIG. 1, and FIG. 3 is a cross-sectional view schematically showing a polymer film on a surface of an insulating film according to an exemplary embodiment of the present disclosure.

In FIG. 1, the light emitting element LD according to an exemplary embodiment of the present disclosure is shown as a light emitting element having a circular cylinder shape, but a type (e.g., composition) and/or shape of the light emitting element LD according to an exemplary embodiment of the present disclosure is not limited thereto.

Referring to FIGS. 1 to 2B, the light emitting element LD according to an exemplary embodiment of the present disclosure includes a first semiconductor layer 11, a second semiconductor layer 13, and an active layer 12 interposed between the first and second semiconductor layers 11 and 13. According to an exemplary embodiment, the light emitting element LD may include a stacked structure in which the first semiconductor layer 11, the active layer 12, and the second semiconductor layer 13 are sequentially stacked in a length direction.

The light emitting element LD may be provided in a rod shape extending in one direction. When an extending direction of the light emitting element LD is referred to as a length direction, the light emitting element LD may have one end and the other end in the length direction. According to an exemplary embodiment, one of the first and second semiconductor layers 11 and 13 may be located at one end of the light emitting element LD, and the other of the first and second semiconductor layers 11 and 13 may be located at the other end of the light emitting element LD.

The light emitting element LD may be a rod-shaped light emitting diode manufactured to have a rod shape. In this specification, the term "rod-shaped" refers to a rod-like shape or bar-like shape that is long (e.g., having an aspect ratio greater than 1) in the length direction, such as a circular cylinder or polygonal cylinder, but a shape of a cross section thereof is not particularly limited. For example, the length of the light emitting element LD may be larger than a diameter (or width of the cross section) thereof. Hereinafter, for better understanding and ease of description, the light emitting element LD will be described as having a circular cylinder shape, but the present disclosure is not limited thereto.

According to an exemplary embodiment, the light emitting element LD may have a size that is as small as a nanoscale to a microscale, for example, the light emitting element LD may have a diameter and/or a length of a nanoscale or a microscale range. However, the size of the light emitting element LD in embodiments of the present disclosure is not limited thereto. For example, the size of the light emitting element LD may be variously changed according to design conditions of various suitable devices such as, for example a display device, using a light emitting device including the light emitting element LD as a light source.

For example, the first semiconductor layer 11 may include at least one n-type semiconductor layer. For example, the first semiconductor layer 11 may include any one semiconductor material selected from InAlGaN, GaN, AlGaN, InGaN, AlN, and InN, and may include an n-type semiconductor layer doped with a first conductive dopant such as Si, Ge, Sn, and/or the like. However, the material constituting the first semiconductor layer 11 is not limited thereto, and the first semiconductor layer 11 may be formed of various suitable materials.

The active layer 12 may be on the first semiconductor layer 11, and may be formed to have a single or multiple quantum well structure. In an exemplary embodiment, a cladding layer doped with a conductive dopant may be formed on and/or under the active layer 12. For example, the cladding layer may be formed of an AlGaN layer and/or an InAlGaN layer. According to an exemplary embodiment, materials such as AlGaN and/or AlInGaN may be used to form the active layer 12, and various suitable materials may constitute the active layer 12.

When an electric field of more than a set or predetermined voltage is applied to both ends of the light emitting element LD, the light emitting element LD emits light while electron-hole pairs are coupled in the active layer 12. By controlling the light emission of the light emitting element LD by using this principle, the light emitting element LD can be used as a light source of various suitable light emitting devices including pixels of the display device. The active layer 12 may include one surface contacting the first semiconductor layer 11 and the other surface contacting the second semiconductor layer 13.

The second semiconductor layer 13 may be on the active layer 12 and may include a semiconductor layer of a different type (e.g., p-type or n-type) from the first semiconductor layer 11. For example, the second semiconductor layer 13 may include at least one p-type semiconductor layer. For example, the second semiconductor layer 13 may include at least one semiconductor material selected from InAlGaN, GaN, AlGaN, InGaN, AlN, and InN, and may include a p-type semiconductor layer doped with a second conductive dopant such as Mg, and/or the like. However, the material constituting the second semiconductor layer 13 is not limited thereto, and various other suitable materials may constitute the second semiconductor layer 13.

Referring to FIG. 2B, in an exemplary embodiment of the present disclosure, the light emitting element LD may include an electrode layer 16 on the second semiconductor layer 13. For example, the light emitting element LD may include a stacked structure stacked in order of a first semiconductor layer 11, an active layer 12, a second semiconductor layer 13, and an electrode layer 16. In the exemplary embodiment described below, the stacked structure including the first semiconductor layer 11, the active layer 12, the second semiconductor layer 13, and the electrode layer 16 will be referred to as a light emitting stacked pattern.

The light emitting stacked pattern may have a circular cylinder shape, and the light emitting element LD may also have a circular cylinder shape corresponding to the light emitting stacked pattern. In addition, the first semiconductor layer 11, the active layer 12, the second semiconductor layer 13, and the electrode layer 16 included in the light emitting stacked pattern may have a circular cylinder shape.

The first semiconductor layer 11 may be located at one end of the light emitting element LD, and the electrode layer 16 may be located at the other end of the light emitting element LD. The light emitting element LD may include a lower surface of the first semiconductor layer 11 and an upper surface of the electrode layer 16 which is located at both ends of the light emitting element LD and exposed to the external (e.g., exposed to an exterior of the light emitting element LD). The lower surface of the first semiconductor layer 11 and the upper surface of the electrode layer 16 may be surfaces electrically coupled by contacting an external conductive material.

When the light emitting element LD has a circular cylinder shape, the first semiconductor layer 11 may be under the circular cylinder, and the electrode layer 16 may be on the circular cylinder. When the light emitting element LD has a circular cylinder shape, each of the lower surface of the first semiconductor layer 11 and the upper surface of the electrode layer 16 may be formed in a circular shape (e.g., a substantially circular shape).

According to the exemplary embodiment, when the light emitting element LD has an elliptical cylinder shape, each of the lower surface of the first semiconductor layer 11 and the upper surface of the electrode layer 16 may be formed in an elliptical shape (e.g., a substantially elliptical shape). In addition, according to another exemplary embodiment, when the light emitting element LD has a polygonal cylinder shape, each of the lower surface of the first semiconductor layer 11 and the upper surface of the electrode layer 16 may be formed in a polygonal shape (e.g., a substantially polygonal shape).

The electrode layer 16 may be an ohmic contact electrode electrically coupled to the second semiconductor layer 13, but is not limited thereto. According to an exemplary embodiment, the electrode layer 16 may be a Schottky contact electrode (e.g., an electrode formed by a junction of a semiconductor and a metal). The electrode layer 16 may include a metal and/or a metal oxide. For example, the electrode layer 16 may include Cr, Ti, Al, Au, Ni, ITO, IZO, ITZO, an oxide, and/or an alloy thereof alone or in combination. In addition, the electrode layer 16 may be substantially transparent or translucent. Accordingly, light generated in the active layer 12 of the light emitting element LD may be emitted through the electrode layer 16 to the external of the light emitting element LD (e.g., to an exterior of the light emitting element LD).

As shown in FIGS. 1 to 2B, the light emitting element LD may further include an insulating film 14 provided on the surface of the light emitting stacked pattern. The insulating film 14 may include a transparent insulating material. For example, the insulating film 14 may include at least one insulating material selected from the group consisting of $SiO_2$, $Si_3N_4$, $Al_2O_3$, and $TiO_2$, but is not limited thereto, and may include various other suitable materials having insulation (e.g., that are electrically insulating).

The insulating film 14 can prevent or reduce electric shorts (e.g., short circuits) that may occur when the active layer 12 contacts a conductive material other than the first semiconductor layer 11 and the second semiconductor layer 13. In addition, the insulating film 14 can minimize or reduce surface defects of the light emitting element LD to improve life-span and efficiency of the light emitting element LD. In addition, when a plurality of light emitting elements LD are located closely to each other, the insulating film 14 can prevent or reduce unwanted electric shorts (e.g., short circuits) that may occur between the light emitting elements LD.

The insulating film 14 may be formed on the surface of the light emitting stacked pattern to surround at least the outer peripheral (e.g., circumferential) surface of the active layer 12, and may further surround one area of the first and second semiconductor layers 11 and 13 and an outer peripheral (e.g., circumferential) surface of the electrode layer 16.

In an exemplary embodiment of the present disclosure, the insulating film 14 may expose at least one of both ends of the light emitting element LD having a different polarity. In FIGS. 1 to 2B, the insulating film 14 is shown to surround all outer peripheral (e.g., circumferential) surfaces of first and second semiconductor layers 11 and 13, but the insulating film 14 may be exposed to the outside of the light emitting element LD without covering a portion of the first semiconductor layer 11 of the first and second semiconductor layers 11 and 13 located at both ends of the light emitting element LD in the length direction.

The insulating film 14 may include an inner surface directly contacting the surface of the light emitting stacked pattern and an outer surface facing the inner surface. In addition, the insulating film 14 may include an upper surface and a lower surface parallel to (e.g., substantially parallel to) one direction (e.g., horizontal direction) crossing the length direction of the light emitting element. In some embodiments, the surface of the insulating film 14 may include the outer surface, the upper surface and the lower surface.

Referring to FIGS. 1 to 2B, in an exemplary embodiment of the present disclosure, a polymer film 15 may be on at least a portion of the surface of the insulating film 14. Providing the polymer film 15 on the surface of the insulating film 14 of the light emitting element LD improves the dispersibility and/or solubility of the light emitting element LD in a composition described herein below. In addition, because the light emitting element LD with the polymer film 15 has excellent dispersion stability in the composition, even after a long time, the light emitting element LD may be homogeneously dispersed in the composition without sinking (e.g., precipitating) in the composition.

In FIGS. 1 to 2B, the polymer film 15 is shown to be on the outer surface of the surface of the insulating film 14, but a position of the polymer film 15 is not limited thereto. For example, the polymer film 15 may be on the outer surface, the upper surface, and the lower surface of the insulating film 14.

In an exemplary embodiment of the present disclosure, as shown in FIG. 3, the polymer film 15 may include a polymer chain PC. In this case, the polymer chain PC may be provided on the insulating film 14. For example, the polymer film 15 may include a linker compound, and the linker compound may couple the surface of the insulating film 14 to an end of the polymer chain PC. In some embodiments, the polymer chain PC may be introduced to (e.g., bonded to) the surface of the insulating film 14 through the linker compound.

The linker compound may include a functional group that can be bonded to the surface of the insulating film 14 and the end of the polymer chain PC. For example, the linker compound may be a compound containing at least one of a $C_1$-$C_{20}$ alkylene group, an alkylamine group represented by —$(CH_2)_n$—$NR_1$— (herein n is an integer of 1 or more, and $R_1$ is hydrogen or a $C_1$-$C_{20}$ alkyl group), a $C_1$-$C_{20}$ ester group, a $C_1$-$C_{20}$ ketone group, a $C_1$-$C_{20}$ amide group, and a siloxane group. However, a type (e.g., composition) of the linker compound is not limited thereto, and the linker compound may be selected according to a type (e.g., composition) of a material constituting the insulating film 14 and a type (e.g., composition) of a monomer used for polymerizing the polymer chain PC (e.g., the monomer polymerized to form the polymer chain PC).

In an exemplary embodiment of the present disclosure, a compound containing a siloxane group may be used as the linker compound. For example, any one selected from the following compound 1, compound 2, and compound 3 may be used as a linker compound including the siloxane group.

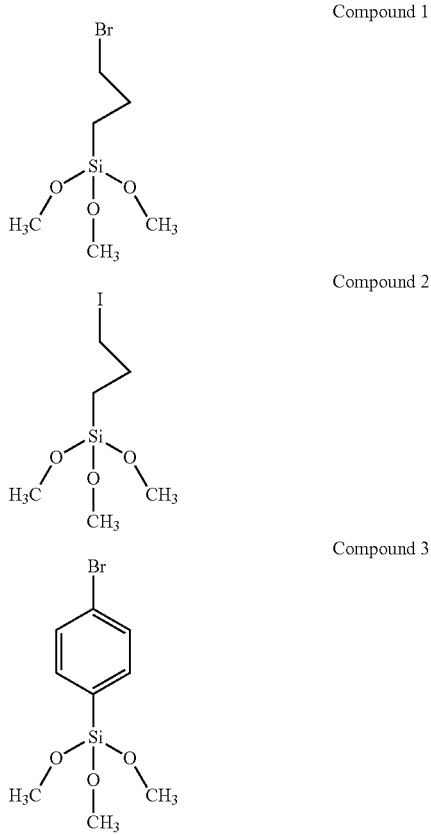

Hereinafter, embodiments of the present disclosure will be described according to an exemplary embodiment using a compound containing the siloxane group as a linker compound.

Through a surface treatment of the insulating film 14, the linker compound may be introduced to (e.g., bonded to) the surface of the insulating film 14. For example, through the surface treatment of the insulating film 14, in the compound 1 to compound 3, a methyl group —$CH_3$ bonded to an oxygen bonded to silicon (e.g., an oxygen of a siloxane bond (e.g., Si—O)) of the siloxane group may be released, and the oxygen atom is bonded to the surface of the insulating film 14. In the compound 1 to compound 3, a carbon atom to which a halogen atom (e.g., Br and I) is bonded is electrophilic, the halogen atom may be released from the carbon atom that is electrophilic, and the end of the polymer chain PC is bonded to the released position (e.g., is bonded to the carbon atom that was previously bonded to the halogen atom).

Therefore, as shown in FIG. 3, one end of the linker compound (e.g., compound 1) may be bonded to the surface of the insulating film 14, and the other end of the linker compound may be bonded to the polymer chain PC.

A method of bonding the polymer chain PC to the linker compound may be a method which uses any suitable polymerization reaction or coupling reaction generally used in the art. For example, the polymer chain PC may be grown by bonding a monomer used for polymerization of the polymer chain PC to the end of the linker compound and then performing a polymerization reaction of the monomer at the end of the linker compound (e.g., the polymer chain PC may be grown by polymerizing the monomer from the end of the linker compound). In addition, the polymer chain PC may be bonded to the linker compound by performing a coupling reaction between the end of the polymer chain PC formed by polymerizing monomers and the end of the linker compound (e.g., the polymer chain PC may be polymerized and then bonded to the linker compound through a coupling reaction). However, a method of bonding the polymer chain PC to the linker compound is not limited thereto.

In an exemplary embodiment of the present disclosure, the polymer chain PC may include an aliphatic hydrocarbon repeat unit in the main chain. For example, the main chain of the polymer chain PC may include a polymerization unit (e.g., repeat unit) derived from an aliphatic hydrocarbon monomer. The aliphatic hydrocarbon repeat unit may form a backbone of the polymer chain PC. In the present disclosure, the aliphatic hydrocarbon repeat unit may be included in the polymer chain PC such that there is no aromatic group in the repeat unit of the main chain of the polymer chain PC. In addition, the aliphatic hydrocarbon repeat unit may include a polar substituent and/or a nonpolar substituent.

The main chain of the polymer chain PC including the aliphatic hydrocarbon repeat unit may have a carbon number of 10 or more (e.g., all of the aliphatic hydrocarbon repeat units may together include 10 or more carbon atoms). For example, the main chain of the polymer chain PC made of the aliphatic hydrocarbon repeat unit may include 10 carbons or more. By providing the polymer chain PC including the main chain having a carbon number of 10 or more to the surface of the insulating film 14 of the light emitting element LD, solubility and/or dispersibility of the light emitting element LD in a solvent may be increased.

In an exemplary embodiment of the present disclosure, at least one substituent selected from a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, and a thiol group may be bonded to the main chain of the polymer chain.

In some embodiments, the aliphatic hydrocarbon repeat unit may contain at least one substituent of hydrogen, a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

As described herein below, a type (e.g., composition) of the substituent included in the aliphatic hydrocarbon repeat unit may be set according to a type (e.g., composition) of the solvent included in the composition. In some embodiments, the type (e.g., composition) of the solvent included in the composition may be set or determined according to the type (e.g., composition) of the substituent included in the aliphatic hydrocarbon repeat unit. For example, in consideration of the type (e.g., composition) of the substituent included in the main chain of the polymer chain PC and the type (e.g., composition) of the functional group included in the solvent, the light emitting elements with excellent dispersibility and/or solubility in the composition can be implemented.

In an exemplary embodiment of the present disclosure, the polymer chain PC may include a repeat unit including an aromatic ring in the main chain. For example, the main chain of the polymer chain PC may include a polymerization unit derived from a monomer including the aromatic ring. The repeat unit including the aromatic ring may form a backbone of a main chain of the polymer chain PC. In addition, the repeat unit including the aromatic ring may include a polar substituent and/or a nonpolar substituent.

The main chain of the polymer chain PC including the repeat unit including the aromatic ring may include 10 aromatic rings or more (e.g., all of the repeat units including the aromatic ring may together include 10 or more aromatic rings). In addition, the main chain of the polymer chain PC including the repeat unit including an aromatic ring may have a carbon number of 10 or more (e.g., may include 10 or more carbon atoms). In this case, a carbon number of the main chain of the polymer chain PC may refer to the number of carbon atoms included in the main chain except for the carbon included in the aromatic ring. For example, the main chain of the polymer chain PC including the repeat unit including an aromatic ring may include 10 or more non-aromatic carbon atoms, where the non-aromatic carbon atoms may be, for example, bridging carbon atoms that couple the repeat units to each other.

By providing the polymer chain PC including the main chain having an aromatic ring of a number of 10 or more (e.g., including 10 or more aromatic rings) and a carbon number of 10 or more (e.g., including 10 or more non-carbon atoms) on the surface of the insulating film 14 of the light emitting element LD, the dispersibility and/or solubility of the light emitting element LD in the solvent may be further improved.

In an exemplary embodiment of the present disclosure, the repeat unit including the aromatic ring may contain at least one substituent of hydrogen, a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

In an exemplary embodiment of the present disclosure, a molecular weight of the polymer chain PC may be 2,000 g/mol or more and 1,000,000 g/mol or less (e.g., 2,000 or more daltons to 1,000,000 or less daltons). For example, the molecular weight of the polymer chain PC may be 3,000 g/mol (or daltons) or more and 900,000 g/mol (or daltons) or less, 5,000 g/mol (or daltons) or more and 800,000 g/mol (or daltons) or less, 10,000 g/mol (or daltons) or more and 600,000 g/mol (or daltons) or less, 50,000 g/mol (or daltons) or more and 500,000 g/mol (or daltons) or less, or 100,000 g/mol (or daltons) or more and 350,000 g/mol or less.

For example, the molecular weight of the polymer chain PC may be 2,000 g/mol (or daltons) or more and 10,000 g/mol (or daltons) or less, 15,000 g/mol (or daltons) or more and 50,000 g/mol (or daltons) or less, 100,000 g/mol (or daltons) or more and 500,000 g/mol (or daltons) or less, or 600,000 g/mol (or daltons) or more and 1,000,000 g/mol (or daltons) or less. The molecular weight of the polymer chain PC can be controlled by adjusting the polymerization reaction of the monomer to achieve the desired molecular weight.

By adjusting the molecular weight of the polymer chain PC in the above-described range, the light emitting element LD having excellent dispersibility and/or solubility in the solvent may be implemented. Therefore, the light emitting element LD may be homogeneously dispersed in the solvent.

In an exemplary embodiment of the present disclosure, a thickness of the polymer film 15 may be 10 nm or more and 100 nm or less. For example, the thickness of the polymer film 15 may be 20 nm or more and 80 nm or less, 30 nm or more and 70 nm or less, or 35 nm or more and 50 nm or less. In some embodiments, the thickness of the polymer film 15 may be 10 nm or more and 25 nm or less, 30 nm or more and 50 nm or less, or 75 nm or more and 100 nm or less.

When the thickness of the polymer film 15 is within the above-described range, the dispersibility and/or solubility of the light emitting element LD in the solvent may be further improved. In addition, by adjusting the thickness of the polymer film 15 in the above-described range, a defect of the surface of the light emitting element LD may be minimized or reduced to improve the life-span and efficiency of the light emitting element LD.

In an exemplary embodiment of the present disclosure, the polymer chain PC may include a repeat unit represented by the following Chemical Formula 1.

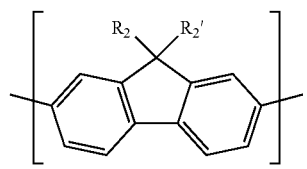

Chemical Formula 1

In Chemical Formula 1, each of $R_2$ and $R_2'$ may be independently hydrogen, a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

In some embodiments, in Chemical Formula 1, each of $R_2$ and $R_2'$ may be independently hydrogen, a $C_1$-$C_{10}$ alkyl group or a $C_3$-$C_{10}$ alkyl group, a $C_2$-$C_{10}$ ether group, a $C_2$-$C_{10}$ ester group, a hydroxyl group, a $C_1$-$C_{10}$ alkoxy group, or an acryl group.

In an exemplary embodiment of the present disclosure, the polymer chain PC may include a repeat unit represented by the following Chemical formula 2.

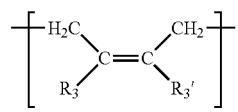

Chemical Formula 2

In Chemical Formula 2, each of $R_3$ and $R_3'$ may be independently hydrogen, a $C_1$-$C_{10}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

In some embodiments, in Chemical Formula 2, each of $R_3$ and $R_3'$ may be independently hydrogen, a $C_1$-$C_5$ alkyl group or a $C_3$-$C_5$ alkyl group, a $C_2$-$C_5$ ether group, a $C_2$-$C_5$ ester group, a hydroxyl group, a $C_1$-$C_5$ alkoxy group, or an acryl group.

In an exemplary embodiment of the present disclosure, the polymer chain PC may include a repeat unit represented by the following Chemical Formula 2-1.

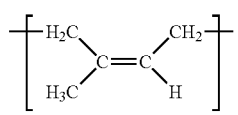

Chemical Formula 2-1

In an exemplary embodiment of the present disclosure, the polymer chain PC may include a repeat unit represented by the following Chemical Formula 3.

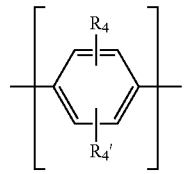

Chemical Formula 3

In Chemical Formula 3, each of $R_4$ and $R_4'$ may be independently hydrogen, a $C_1$-$C_{20}$ alkyl group or a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

In some embodiments, in Chemical Formula 3, each of $R_4$ and $R_4'$ may be independently a $C_1$-$C_{10}$ alkyl group, a $C_1$-$C_{10}$ ether group, a $C_1$-$C_{10}$ ester group, a hydroxyl group, a $C_1$-$C_{10}$ alkoxy group, or an acryl group.

In an exemplary embodiment of the present disclosure, the polymer chain PC may include a repeat unit represented by the following Chemical Formula 3-1.

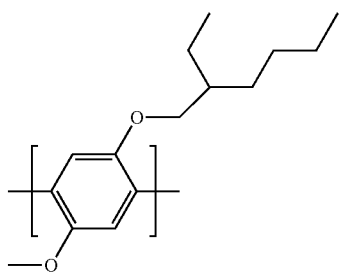

Chemical Formula 3-1

According to an exemplary embodiment of the present disclosure, by introducing the polymer chain PC including at least one of the repeat units represented by Chemical Formula 1 to 3 to the surface of the insulating film 14 of the light emitting element LD as described above, the light emitting element LD having the excellent dispersibility and/or solubility in the solvent may be effectively implemented.

The light emitting element LD described above may be used as a light source of various suitable display devices.

FIGS. 4A to 4K are cross-sectional views sequentially showing an embodiment of a manufacturing method of a light emitting element.

Referring to FIGS. 1 to 2B, and 4A, a substrate 1, which is configured to support the light emitting element LD, is provided.

The substrate 1 may be GaAs, GaP, InP, and/or sapphire substrates. The substrate 1 may be a wafer for epitaxial growth. The substrate 1 may include a ZnO substrate having a GaAs layer on a surface thereof. In addition, the substrate 1 may include a Ge substrate having a GaAs layer on a surface thereof, and/or a Si substrate having a GaAs layer on a Si wafer with a buffer layer interposed therebetween.

The substrate 1 may include any suitable commercially available single crystal substrate manufactured by any suitable method generally available in the art. If a selection ratio for manufacturing the light emitting element LD can be satisfied and an epitaxial growth can be smoothly performed, the material of the substrate 1 is not limited thereto. In the following exemplary embodiment, the substrate 1 will be described as a sapphire substrate, but the present disclosure is not limited thereto.

An epitaxial growing surface of the substrate 1 may be smooth. The substrate 1 may be changed in size and diameter according to a product to which the substrate 1 is applied, and may be manufactured in a form capable of reducing warpage due to a stacked structure due to the epitaxial growth. The shape of the substrate 1 is not limited to a circular shape, but may be, for example, a polygonal shape such as a rectangular shape, and/or the like.

Referring to FIGS. 1 to 2B, 4B, a sacrificial layer 3 is formed on the substrate 1. The sacrificial layer 3 may be formed on the substrate 1 by using a metal organic chemical vapor deposition (MOCVD) method, a molecular beam epitaxy (MBE) method, a vapor-phase epitaxy (VPE) method, a liquid phase epitaxy (LPE) method, and/or the like.

The substrate 1 and the sacrificial layer 3 may be in contact (e.g., direct or physical contact) with each other. The sacrificial layer 3 may be between the light emitting element LD and the substrate 1 in the process of manufacturing the light emitting element LD to physically separate the light emitting element LD and the substrate 1.

The sacrificial layer 3 may have various suitable shapes of structures, and may have a single layer structure or a multi-layer structure. The sacrificial layer 3 may be formed of GaAs, AlAs and/or AlGaAs. Meanwhile, according to the manufacturing method of the light emitting element LD, a step of forming the sacrificial layer 3 on the substrate 1 may be omitted. In this case, the first semiconductor layer 11 may be formed on the substrate 1.

Referring to FIGS. 1 to 2B, and 4C, the first semiconductor layer 11 is formed on the sacrificial layer 3. Like the sacrificial layer 3, the first semiconductor layer 11 may be formed through the epitaxial growth, and may be formed by using a MOCVD method, an MBE method, a VPE method, an LPE method, or the like. According to an exemplary embodiment, an additional semiconductor layer for improving crystallinity, such as a buffer layer and a non-doping semiconductor layer, may be further formed between the first semiconductor layer 11 and the sacrificial layer 3.

The first semiconductor layer 11 may include a semiconductor material composed of group III (e.g., Ga, Al, In) to group V (e.g., P, As), and may include a semiconductor layer doped with a first conductive dopant such as Si, Ge, Sn, and the like. For example, the first semiconductor layer 11 may include at least one semiconductor material of GaP, GaAs, GaInP, or AlGaInP doped with Si. In some embodiments, the first semiconductor layer 11 may include at least one n-type semiconductor layer. The material constituting the first semiconductor layer 11 is not limited thereto, and various suitable materials may constitute the first semiconductor layer 11.

Referring to FIGS. 1 to 2B, and 4D, the first active layer 12 is formed on the semiconductor layer 11. The active layer 12 may be an area in which electrons and holes recombine, may transition to a lower energy level as the electrons and holes recombine, and may emit light with a corresponding wavelength.

The active layer 12 may be formed on the first semiconductor layer 11 and may have a single or multiple quantum well structure. A position of the active layer 12 may be changed in various suitable ways according to the type (e.g., composition, shape, etc.) of the light emitting element LD.

The active layer 12 may include at least one material of GaInP, AlGaInP, GaAs, AlGaAs, InGaAs, InGaAsP, InP, or InAs. The active layer 12 can emit light with a wavelength of 400 nm to 900 nm. The active layer 12 may use a double heterostructure. According to an exemplary embodiment, a cladding layer doped with a conductive dopant may be further formed on the upper surface and/or the lower surface of the active layer 12.

Referring to FIGS. 1 to 2B, and 4E, the second semiconductor layer 13 is formed on the active layer 12. The second semiconductor layer 13 may include a semiconductor layer of a type (e.g., p-type or n-type) different from the first semiconductor layer 11. The second semiconductor layer 13 may include a semiconductor material composed of group III (e.g., Ga, Al, In) to group V (e.g., P, As), and may include a semiconductor layer doped with a second conductive dopant such as Mg, and the like. For example, the second semiconductor layer 13 may include at least one semiconductor material of GaP, GaAs, GaInP, or AlGaInP doped with Mg. In some embodiments, the second semiconductor layer 13 may include a p-type semiconductor layer. The material constituting the second semiconductor layer 13 is not limited thereto, and various suitable materials may constitute the second semiconductor layer 13.

Referring to FIGS. 1 to 2B, and 4F, an electrode layer 16 is formed on the second semiconductor layer 13. The electrode layer 16 may include a metal or a metal oxide. For example, the electrode layer 16 may include Cr, Ti, Al, Au, Ni, ITO, IZO, ITZO and oxide or alloy thereof alone or in combination. In an exemplary embodiment of the present disclosure, the electrode layer 16 may minimize or reduce a loss of light that is generated in the active layer 12 and emitted out of the light emitting element LD, and may be made of a transparent metal oxide such as indium tin oxide (ITO) to improve a current spreading effect to the second semiconductor layer 13.

As described above, the first semiconductor layer 11, the active layer 12, the second semiconductor layer 13 and the electrode layer 16 stacked sequentially on the substrate 1 constitute a light emitting stack.

Referring to FIGS. 1 to 2B, and 4G, the light emitting stack may be etched in a vertical direction to form a light emitting stacked pattern 10. After providing a mask on the light emitting stack, a first etching process is performed to pattern the light emitting stack at nanoscale or microscale intervals, thereby forming a plurality of light emitting stacked patterns 10.

Figure 4A:
FIGS. 4A to 4K are cross-sectional views sequentially showing a manufacturing method of a light emitting element.
Figure 4B:
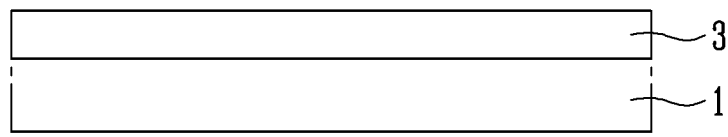
Figure 4C:
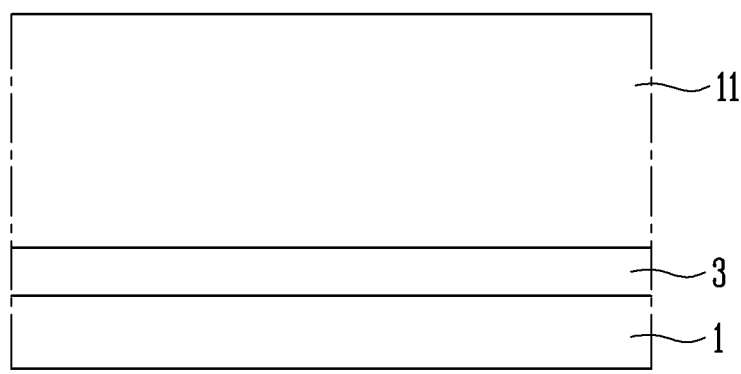
Figure 4D:
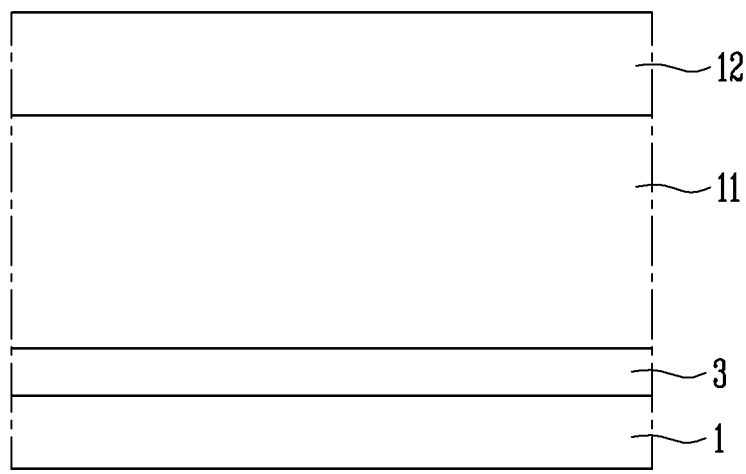
Figure 4E:
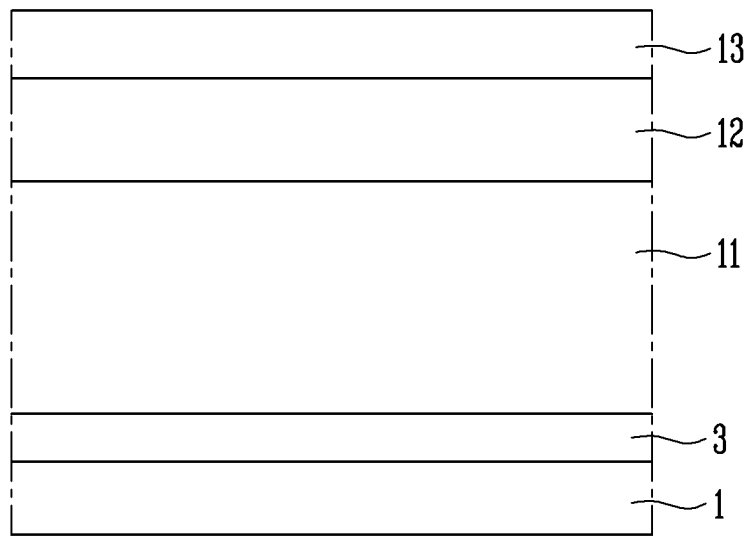
Figure 4F:
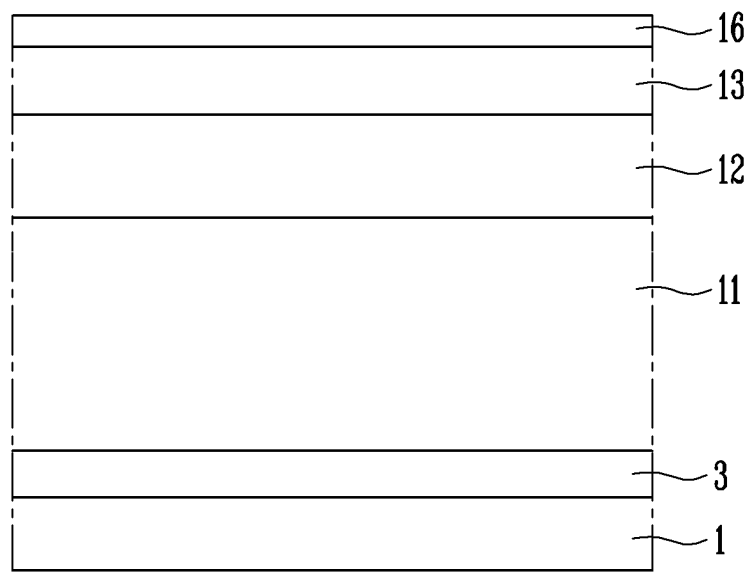
Figure 4G:
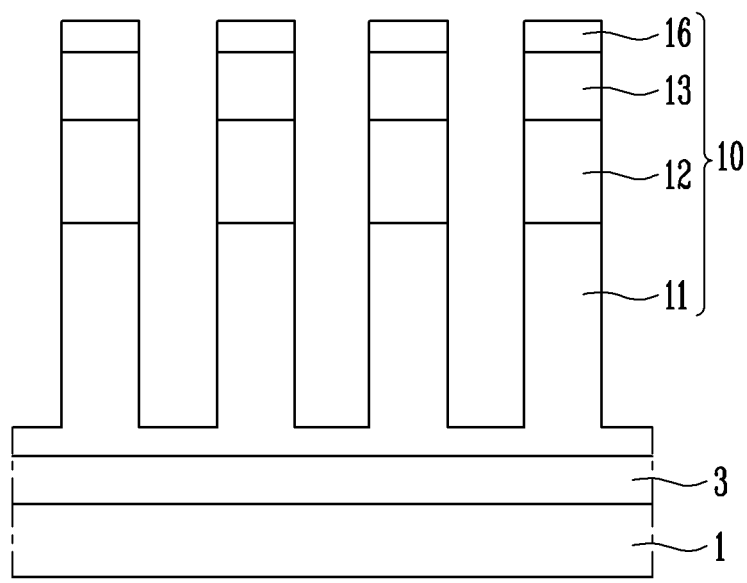
Figure 4H:
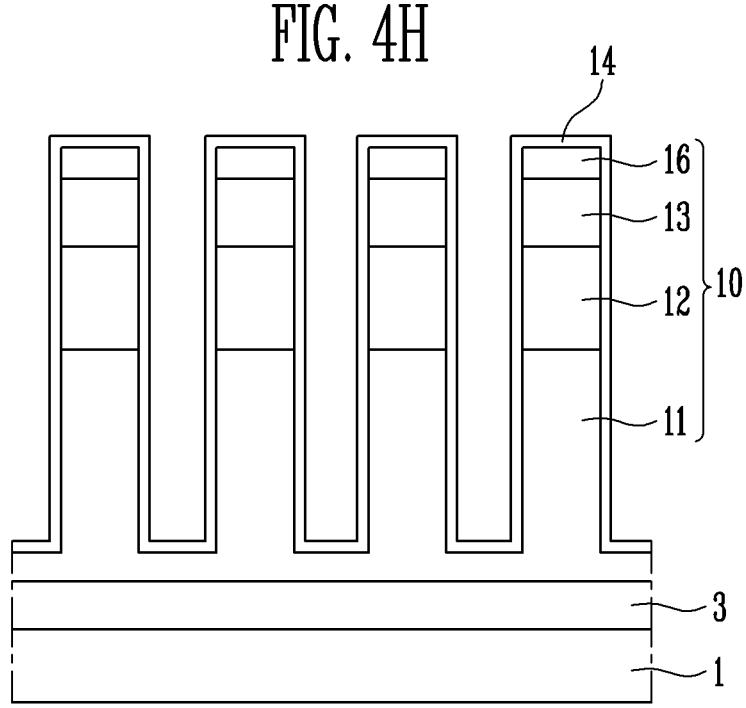
Figure 4I:
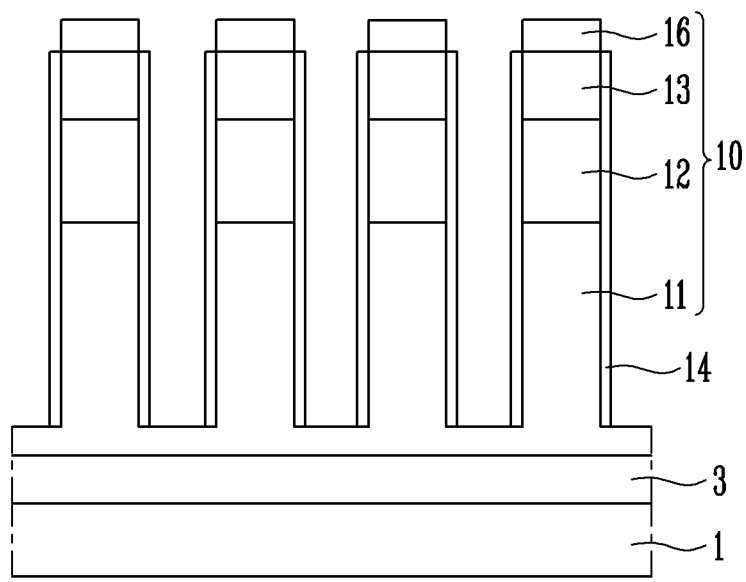

In an exemplary embodiment of the present disclosure, the mask may include a plurality of openings, and one area of the light emitting stack corresponding to the openings is etched to form a groove portion exposing one area of the first semiconductor layer 11 to the outside. Referring to FIG. 4G, one area of the first semiconductor layer 11 facing one surface of the substrate 1 may be exposed to the outside.

One area of the light emitting stack corresponding to the opening of the mask may be etched, and other area of the light emitting stack not corresponding to the opening of the mask may be not etched. According to the exemplary embodiment, the opposite of the above may also be possible. For example, one area of the light emitting stack corresponding to the opening of the mask may not be etched, and one area of the light emitting stack not corresponding to the opening of the mask may be etched.

A first etching method may be a dry etching method, such as a reactive ion etching (RIE), a reactive ion beam etching (RIBE), or an inductively coupled plasma reactive ion etching (ICP-RIE). Unlike a wet etching method, the dry etching method is suitable for forming light emitting stacked patterns 10 because one-sided etching is possible.

In an exemplary embodiment of the present disclosure, each of light emitting stacked patterns 10 may have a size of nanoscale or microscale.

After performing the first etching process, residues remaining on the light emitting stacked pattern 10 may be removed through an existing wet etching or dry etching method, but are not limited thereto, and may be removed through an existing removal method. Here, the residues may include an etching mask, an insulating material, and the like required for the mask process.

Referring to FIGS. 1 to 2B, and 4H, the insulating film 14 is formed on the light emitting stacked patterns 10 and one area of the first semiconductor layer 11 exposed to the outside. For example, the insulating film 14 can cover the first semiconductor layer 11, the active layer 12, the second semiconductor layer 13, and the electrode layer 16 so that the first semiconductor layer 11, the active layer 12, the second semiconductor layer 13, and the electrode layer 16 may be not exposed to the outside.

The method of forming the insulating film 14 may use a method of applying an insulating material on the light emitting stacked patterns 10 attached on the substrate 1, but is not limited thereto. The material that can be used as the insulating film 14 may include at least one insulating material selected from the group consisting of $SiO_2$, $Si_3N_4$, $Al_2O_3$, and $TiO_2$, but is not limited thereto. For example, the $Al_2O_3$ film may be formed by atomic layer deposition (ALD), and may be formed by supplying a source made of trimethyl aluminum (TMA) and $H_2O$ in a pulse form and using chemical adsorption and desorption. The thickness of the insulating film 14 may be 30 nm to 150 nm, but is not limited thereto.

Referring to FIGS. 1 to 2B, and 4I, a portion of the insulating film 14 can be removed by performing a secondary etching process. In the secondary etching process, a portion of the insulating film 14 surrounding the electrode layer 16 and a portion of the insulating film 14 covering one area of the first semiconductor layer 11 facing one surface of the substrate 1 may be removed. Therefore, the insulating film 14 may be provided on the outer surface of the light emitting stacked pattern 10. For example, the light emitting stacked pattern 10 surrounded by the insulating film 14 may be formed on the substrate 1 by performing the secondary etching process.

Figure 4J:
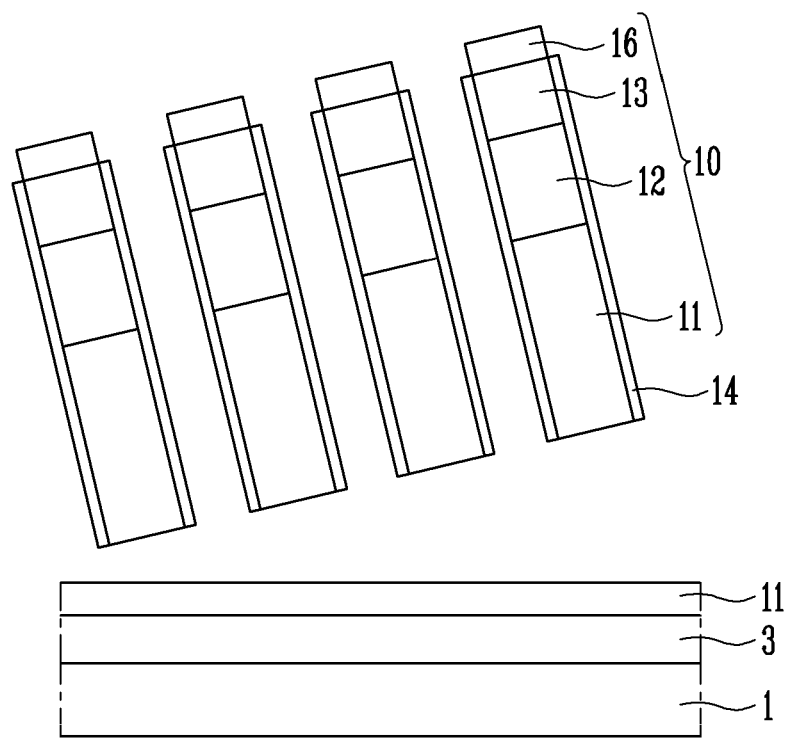

Referring to FIGS. 1 to 2B, and 4J, the light emitting stacked pattern 10 surrounded by the insulating film 14 may be separated from the substrate 1 by using a chemical lift-off (CLO) method. The chemical lift-off may be performed at an interface between the first semiconductor layer 11 of the light emitting stacked pattern 10 and the first semiconductor layer 11 formed on the sacrificial layer 3. Referring to FIG. 4J, as the chemical lift-off is performed, a portion of the first semiconductor layer 11 not included in the light emitting stacked pattern 10 is left on the sacrificial layer 3.

The light emitting stacked pattern 10 separated from the substrate 1 may be a state in which the electrode layer 16, the surface of the insulating film 14, and the lower surface of the first semiconductor layer 11 are exposed to the outside.

Figure 4K:
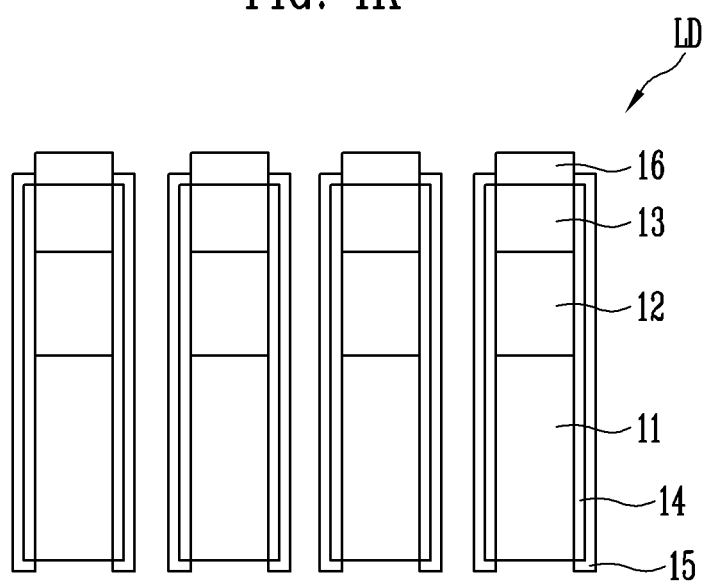

Referring to FIGS. 1 to 2B, and 4K, the light emitting element LD may be manufactured by forming the polymer film 15 on the surface of the insulating film 14 of the light emitting stacked pattern 10. The polymer film 15 may be formed on at least a portion of the surface of the insulating film 14, and FIG. 4K shows an exemplary embodiment in which the polymer film 15 is formed on all of the outer surface, upper surface, and lower surface of the insulating film 14.

In an exemplary embodiment of the present disclosure, the linker compound may be introduced to the surface of the insulating film 14 in a step of forming the polymer film 15. The linker compound may be the same as the linker compound described in FIGS. 1 to 3. As described above, through surface treatment of the insulating film 14, one end of the linker compound may be bonded to the surface of the insulating film 14.

In an exemplary embodiment of the present disclosure, the step of forming the polymer film 15 may introduce the polymer chain PC to the surface of the insulating film 14 through a linker compound. For example, the end of the polymer chain PC may be bonded to the other end of the linker compound. As shown in FIG. 3, the linker compound may couple the polymer chain PC to the surface of the insulating film 14.

The method of bonding the polymer chain PC to the linker compound may be a method which uses a polymerization reaction or a coupling reaction used in the prior art. For example, the polymer chain PC may be grown by bonding a monomer used for polymerization of the polymer chain PC to the end of the linker compound and then performing a polymerization reaction of the monomer at the end of the linker compound. In addition, the polymer chain PC may be bonded to the linker compound by performing a coupling reaction between the end of the polymer chain PC formed by polymerizing monomers and the end of the linker compound. However, a method of bonding the polymer chain PC to the linker compound is not limit thereto.

Figure 5:
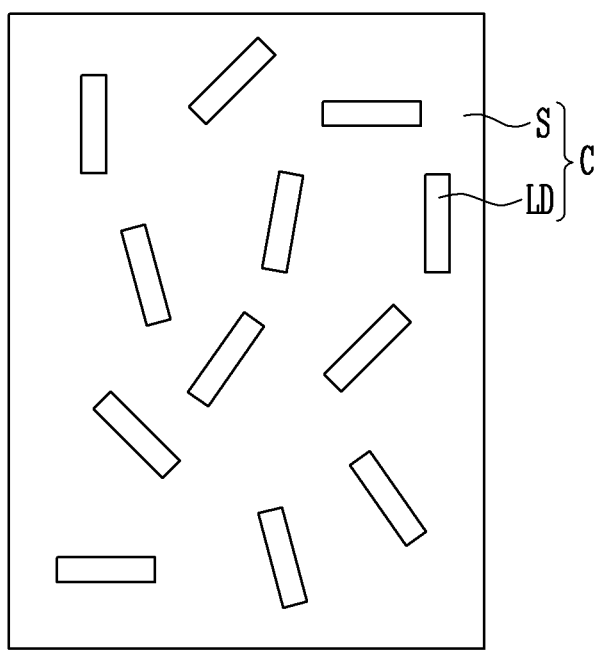
FIG. 5 is a drawing showing a composition including a light emitting element according to an exemplary embodiment of the present disclosure.

FIG. 5 is a drawing showing a composition including a light emitting element according to an exemplary embodiment of the present disclosure.

In an exemplary embodiment of the present disclosure, a configuration not mentioned in the exemplary embodiment described above will be mainly described in order to avoid duplicate description. Parts not particularly described in this exemplary embodiment of the present disclosure may be understood by referring to one of the exemplary embodiments described herein above, noting that the same reference numbers represent the same constituent elements, and the similar reference numbers represent similar constituent elements.

Referring to FIGS. 1 to 3, and 5, a composition C may include a solvent S and a light emitting element LD. The composition C may be an ink composition used to provide a light emitting element LD in a process of manufacturing a display device.

In an exemplary embodiment of the present disclosure, the solvent S may contain at least one of an alkyl solvent containing an alkyl group (e.g., an alkyl solvent containing a compound including an alkyl group), an ether solvent containing an ether group (e.g., an ether solvent containing a compound including an ether group), an ester solvent containing an ester group (e.g., an ester solvent containing a compound including an ester group), an amine solvent containing an amine group (e.g., an amine solvent containing a compound including an amine group), an amide solvent containing an amide group (e.g., an amide solvent containing a compound including an amide group), an alcohol solvent containing an alcohol group (e.g., an alcohol solvent containing a compound including an alcohol group), a urethane solvent containing a urethane group (e.g., a urethane solvent containing a compound including a urethane group), a urea solvent containing a urea group (e.g., a urea solvent containing a compound including a urea group), an imide solvent containing an imide group (e.g., an imide solvent containing a compound including an imide group), an acrylic solvent containing an acrylic group (e.g., an acrylic solvent containing a compound including an acrylic group), or a thiol solvent containing a thiol group (e.g., a thiol solvent containing a compound including a thiol group).

According to a type (e.g., composition) of the solvent S included in the composition C, a type (e.g., composition) of the repeat unit constituting the main chain of the polymer chain PC and a type (e.g., composition) of a substituent included in the repeat unit may be set. In some embodiments, the type (e.g., composition) of solvent S included in the composition C may be set or determined according to the type (e.g., composition) of the repeat unit constituting the main chain of the polymer chain PC and the type (e.g., composition) of the substituent included in the repeat unit.

For example, in consideration of the types (e.g., compositions) of functional groups included in the repeat unit included in the main chain of the polymer chain PC, the substituent, and the solvent, the composition C including the light emitting element LD having excellent dispersibility and/or solubility in the solvent S may be implemented.

By providing the polymer film 15 including the polymer chain PC with excellent solubility and/or dispersibility in solvent S to the light emitting element LD, the light emitting element LD can be homogeneously dispersed in the composition C, and the light emitting element LD may not precipitate or aggregate in the solvent, even after a long time. By using the composition C, it is possible to provide a set or predetermined number of light emitting elements LD per pixel of the display device.

In an exemplary embodiment of the present disclosure, the polymer chain PC may be provided in a form of an organic and/or an inorganic salt. Because the polymer chain PC is provided in the solvent S in the form of an organic and/or an inorganic salt, the dispersibility and/or solubility of the light emitting element LD can be further improved.

The above-detailed description illustrates and explains embodiments of the present disclosure. In addition, the above-detailed description merely illustrates exemplary embodiments of the present disclosure, the subject matter of the present disclosure may be used in various other combinations, changes, and environments as described above, and the scope of the subject matter disclosed herein may be changed or modified within the scope of equivalents and/or techniques or knowledge in the art. Therefore, the above-detailed description is not intended to limit the present disclosure to the disclosed embodiments. In addition, the

What is claimed is:

1. A light emitting element comprising:
a first semiconductor layer;
an active layer on the first semiconductor layer;
a second semiconductor layer on the active layer;
an insulating film surrounding an outer peripheral surface of each of the first semiconductor layer, the active layer and the second semiconductor layer; and
a polymer film including a polymer chain and on at least a portion of a surface of the insulating film,
wherein the polymer chain includes:
i) a repeat unit represented by a following Chemical Formula 1 Chemical Formula 1

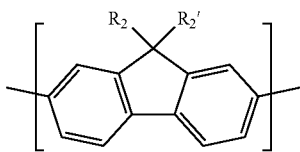

wherein, in Chemical Formula 1, each of $R_2$ and $R_2'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group,
ii) a repeat unit represented by a following Chemical Formula 2 Chemical Formula 2

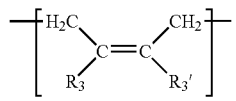

wherein, in Chemical Formula 2, each of $R_3$ and $R_3'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group, or
iii) a repeat unit represented by a following Chemical Formula 3 Chemical Formula 3

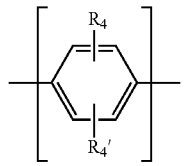

wherein, in Chemical Formula 3, each of $R_4$ and $R_4'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

2. The light emitting element of claim 1, further comprising an electrode layer on the second semiconductor layer.

3. The light emitting element of claim 1, wherein the polymer film further includes a linker compound coupling the surface of the insulating film and an end of the polymer chain.

4. The light emitting element of claim 3, wherein the linker compound comprises a compound containing at least one selected from a $C_1$-$C_{20}$ alkylene group, alkylamine group represented by —$(CH_2)_n$—$NR_1$— (wherein n is an integer of 1 or more, and $R_1$ is hydrogen or a $C_1$-$C_{20}$ alkyl group), a $C_1$-$C_{20}$ ester group, a $C_1$-$C_{20}$ ketone group, a $C_1$-$C_{20}$ amide group, and a siloxane group.

5. The light emitting element of claim 1, wherein a main chain of the polymer chain has a carbon number of 10 or more.

6. The light emitting element of claim 1, wherein a main chain of the polymer chain includes 10 or more aromatic rings.

7. The light emitting element of claim 1, wherein at least one substituent selected from a $C_3$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, and a thiol group is bonded to a main chain of the polymer chain.

8. The light emitting element of claim 1, wherein a molecular weight of the polymer chain is 2,000 g/mol or more and 1,000,000 g/mol or less.

9. The light emitting element of claim 1, wherein a thickness of the polymer film is 10 nm or more and 100 nm or less.

10. A method of manufacturing a light emitting element, the method comprising:
forming a light emitting stack in which a first semiconductor layer, an active layer, and a second semiconductor layer are sequentially stacked on a substrate;
etching the light emitting stack to form a light emitting stacked pattern;
forming an insulating film on the light emitting stacked pattern; and
forming a polymer film including a polymer chain on at least portion of a surface of the insulating film,
wherein the polymer chain includes:
i) a repeat unit represented by a following Chemical Formula 1 Chemical Formula 1

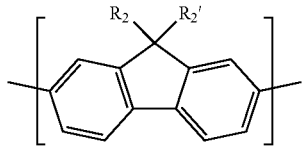

wherein, in Chemical Formula 1, each of $R_2$ and $R_2'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group,
ii) a repeat unit represented by a following Chemical Formula 2 Chemical Formula 2

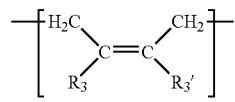

wherein, in Chemical Formula 2, each of $R_3$ and $R_3'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group, or iii) a repeat unit represented by a following Chemical Formula 3 Chemical Formula 3

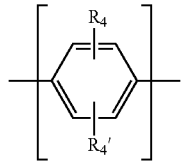

wherein, in Chemical Formula 3, each of $R_4$ and $R_4'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

11. The manufacturing method of claim 10, wherein the forming the polymer film includes introducing a linker compound to a surface of the insulating film.

12. The manufacturing method of claim 11, wherein:
in the forming the polymer film,
an end of the polymer chain formed by polymerization of monomers is bonded to the linker compound.

13. The manufacturing method of claim 11, wherein:
in the forming the polymer film,
monomers are polymerized in the linker compound to form the polymer chain.

14. A composition comprising:
a solvent; and
a light emitting element,
wherein the light emitting element includes:
a first semiconductor layer;
an active layer on the first semiconductor layer;
a second semiconductor layer on the active layer;
an insulating film surrounding an outer peripheral surface of each of the first semiconductor layer, the active layer and the second semiconductor layer; and
a polymer film including a polymer chain and on at least a portion of a surface of the insulating film,
wherein the polymer chain includes:
i) a repeat unit represented by a following Chemical Formula 1 Chemical Formula 1

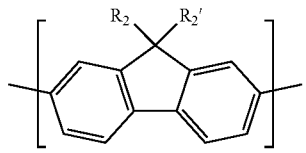

wherein, in Chemical Formula 1, each of $R_2$ and $R_2'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group, ii) a repeat unit represented by a following Chemical Formula 2 Chemical Formula 2

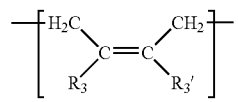

wherein, in Chemical Formula 2, each of $R_3$ and $R_3'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group, or iii) a repeat unit represented by a following Chemical Formula 3 Chemical Formula 3

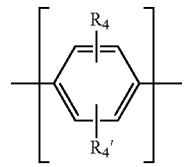

wherein, in Chemical Formula 3, each of $R_4$ and $R_4'$ is independently hydrogen, a $C_1$-$C_{20}$ alkyl group, a $C_2$-$C_{20}$ ether group, a $C_2$-$C_{20}$ ester group, a $C_1$-$C_{20}$ amine group, a $C_2$-$C_{20}$ amide group, a hydroxyl group, a $C_1$-$C_{20}$ alkoxy group, a urethane group, a urea group, an imide group, an acryl group, or a thiol group.

15. The composition of claim 14, wherein the solvent contains:
at least one of an alkyl solvent containing an alkyl group, an ether solvent containing an ether group, an ester solvent containing an ester group, an amine solvent containing an amine group, an amide solvent containing an amide group, alcohol solvent containing an alcohol group, a urethane solvent containing a urethane group, a urea solvent containing a urea group, an imide solvent containing an imide group, an acrylic solvent containing an acrylic group, or a thiol solvent containing a thiol group.

* * * * *